US00RE38719E

(19) United States
(12) Reissued Patent
Ishiguro

(10) Patent Number: US RE38,719 E
(45) Date of Reissued Patent: Apr. 5, 2005

(54) ADJUST BIT DETERMINING CIRCUIT

(75) Inventor: Masayuki Ishiguro, Kasugai (JP)

(73) Assignee: Fujitsu Limited, Kawasaki (JP)

(21) Appl. No.: 09/428,646

(22) Filed: Oct. 28, 1999

Related U.S. Patent Documents

Reissue of:
(64) Patent No.: 5,682,153
Issued: Oct. 28, 1997
Appl. No.: 08/622,007
Filed: Mar. 26, 1996

(30) Foreign Application Priority Data

Jun. 30, 1995 (JP) ..... 7-166612

(51) Int. Cl.[7] ..... H03M 5/00
(52) U.S. Cl. ..... 361/115; 341/53; 341/58; 341/59
(58) Field of Search ..... 341/53, 58, 59; 361/115

(56) References Cited

U.S. PATENT DOCUMENTS

| | | | | | |
|---|---|---|---|---|---|
| 5,142,421 | A | * | 8/1992 | Kahlman et al. | 341/59 |
| 5,198,813 | A | * | 3/1993 | Masaaki et al. | 341/59 |
| 5,451,943 | A | * | 9/1995 | Satomura | 341/58 |
| 5,557,594 | A | * | 9/1996 | Chiba et al. | 369/59 |

FOREIGN PATENT DOCUMENTS

| | | | |
|---|---|---|---|
| EP | 0310041 | 4/1989 | G11B/20/14 |
| EP | 0347934 | 12/1989 | G11B/20/14 |
| EP | 0392506 A2 | 10/1990 | G11B/20/14 |
| EP | 0605206 A2 | 7/1994 | G11B/20/14 |
| EP | 0660325a1 | 6/1995 | G11B/20/14 |
| EP | 0673028 | 9/1995 | G11B/20/14 |
| JP | 1-181330 | 7/1989 | H03M/7/14 |
| JP | 6-195893 | 7/1994 | G11B/20/14 |
| JP | 7-254231 | 10/1995 | G11B/20/12 |

OTHER PUBLICATIONS

Abstract of Japanese Application No. 62–283719, published Dec. 9, 1987.

* cited by examiner

*Primary Examiner*—Stephen W. Jackson
(74) *Attorney, Agent, or Firm*—Staas & Halsey LLP

(57) ABSTRACT

A recording medium for a computer contains sectors, each of which represents a section of data that has originally been supplied by a user. As the user data is sent to the recording medium from the memory of the computer, an adjust bit determining circuit determines the adjust bit for a block of the write data. The adjust bit-value is such that the sum of the DC levels for the write data at a given point is equal to zero or approaches zero. The user data is converted using RLL(1,7) codes and PWM is performed to derive the write data. The circuit includes an encoder for receiving the user data two bits at a time. The encoder outputs DSV values for the 2-bit user data. A first circuit group for accumulating the DSV values from the encoder is used acquire block DSV values of data belonging to the plurality of blocks of the data section. A second circuit group accumulates these block DSV values computed by the first circuit group and calculates a temporary sector DSV value. This temporary sector DSV value represents a DSV value ranging from the head block of the data section up to the current block which is being processed. The first and second circuit groups are controlled by a DSV sequencer. A determining circuit is coupled to the first and second circuit group for comparing the sector DSV value with a block DSV value for a next block following the current block.

13 Claims, 7 Drawing Sheets

ADJUST BIT DETERMINING CIRCUIT

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates generally to the preparation and writing of data from the memory of a computer to a storage medium. More specifically, the invention relates to a method and circuit of determining the adjust bit of write data to be recorded on a recording medium by a pulse width modulation (PWM) system.

2. Description of the Related Art

Recently, there has been an increasing demand for higher recording densities on recording media like magneto-optical disks. Instead of the conventional PPM (Pit Position Modulation) system, the PWM system has been receiving a great deal of attention these days as a method of recording data on a recording medium with a high density.

As a method of recording data on a recording medium, the PWM system is superior to the PWM system in improving the recording density. The PWM system records data in such a manner that the sum of the DC levels become zero or a value close to zero so as to ensure the accurate reading of data. The sum of the total of the widths of the regions in one recording block where a "1" (a positive value) is to be recorded plus the total of the widths of the regions in that recording block where a "0" (a negative value) is to be recorded, should equal zero. That is, the total of the widths of the regions where a "1" is to be recorded is equal to the total of the widths of the regions where a "0" is to be recorded.

Generally, each sector on a recording medium has an ID section and a data section. As what is recorded in the ID section is predetermined, the adjustment required to make the sum of the DC levels zero ("bit adjustment") can be easily determined. Since data from a user ("user data") to be recorded in the data section is not fixed, bit adjustment should be performed as needed. FIG. 1 schematically shows the recording format in a data section 80 after RLL (Run-Length Limited) code conversion. The bit adjustment in this data section 80 is carried out by rewriting an adjust bit area ("adjust bit") 81a consisting of one bit in each of a plurality of resync pattern areas 81 in the data section 80.

FIG. 2 shows the block circuit of a conventional adjust-bit determining circuit 50 which determines the value of the adjust bit 81a.

User data, which is always one-byte data, is input to an encoder 51, which converts the user data to 12 channel bits based on a predetermined RLL code, more particularly, an RLL (1, 7) code, and outputs the resultant data to first and second adjust-bit inserting circuits 52 and 53. This conversion is executed using a conversion table which is incorporated in the encoder 51.

The first and second adjust-bit inserting circuits 52 and 53 sequentially receive the same user data which has been converted to channel bits by the encoder 51. Then, those adjust-bit inserting circuits 52 and 53 add previously-prepared resync pattern data to this user data and output the resultant data to first and second modulators 54 and 55, respectively. The adjust-bit inserting circuits 52 and 53 affix an adjust bit value to be recorded in the adjust bit 81a of the resync pattern area 81. The adjust bit value to be affixed to the user data by the first adjust-bit inserting circuit 52 differs from the adjust bit value to be affixed to the user data by the second adjust-bit inserting circuit 53.

More specifically, the adjust bit value which the first adjust-bit inserting circuit 52 affixes to the user data is "1" while the adjust bit value which the second adjust-bit inserting circuit 53 affixes to the user data is "0". The adjust-bit inserting circuits 52 and 53 convert data of resync patterns to be affixed to user data, based on the aforementioned RLL (1, 7) code.

The first modulator 54 modulates data in the data section 80 (user data, each resync pattern where the adjust bit is "1" and so forth) which has been converted to RLL (1, 7) codes. That is, the first modulator 54 modulates individual pieces of data, converted to RLL (1, 7) codes, to the PWM format from the PPM format and outputs each piece of modulated data to a first up/down counter 56. The second modulator 55 modulates data in the data section 80 (user data, each resync pattern where the adjust bit is "0" and so forth) which has been converted to RLL (1, 7) codes. That is, the second modulator 55 modulates individual pieces of data, converted to RLL (1, 7) codes, to accomplish modulation conversion from PPM to PWM, and outputs each piece of modulated data to a second up/down counter 57.

The first and second up/down counters 56 and 57 sample the data from the first and second modulators 54 and 55 with a predetermined sampling frequency and add "1" to the count values when the sampled values have a high level (logical value of "1"). When the sampled values have a low level (logical value of "0"), the up/down counters 56 and 57 subtract "1" from the count values. That is, each of the first and second up/down counters 56 and 57 acquires the sum of the high and low DC levels. The computation to acquire this sum is generally called Digital Sum Value (DSV) computation.

The first up/down counter 56 samples the PWM data from the first modulator 54, and performs DSV computation. The second up/down counter 57 does likewise for the second modulator 55.

The first and second up/down counters 56 and 57 perform this DSV computation from the head data in the data section 80 (data in a third VFO area 82) on up to immediately before the adjust bit 81a of the second resync pattern area 81. When DSV computation by both counters 56 and 57 is completed, these counters 56 and 57 output count values N1 and N2 to a comparator 58. The comparator 58 compares the count value N1 of the first up/down counter 56 with the count value N2 of the second up/down counter 57.

When the count value N1 is smaller than the count value N2, the comparator 58 outputs a select signal Z to make the adjust bit value "1". Recording a "1" in the adjust bit 81a of the first resync pattern area 81 causes the sum of the DC levels to be closer to zero than recording a "0" in the adjust bit 81a of the first resync pattern area 81.

On the other hand, when the count value N2 is smaller than the count value N1 the comparator 58 outputs a select signal Z to make the adjust bit value "0". Recording a "0" in the adjust bit 81a of the first resync pattern area 81 causes the sum of the DC levels to be closer to zero than recording a "1" in the adjust bit 81a of the first resync pattern area 81.

When DSV computation on up to just before the adjust bit 81a of the third resync pattern area 81 is completed, both counters 56 and 57 output count values N1 and N2 up to that point of time to the comparator 58. The comparator 58 compares both values with each other and outputs the select signal Z for the adjust bit 81a of the previous resync pattern area, i.e., the second resync pattern area 81.

Thereafter, the value of the adjust bit 81a provided in each resync pattern area 81 of the data section 80 is likewise determined. Accordingly, data is recorded on an optical disk in such a way that the sum of the DC levels becomes zero or a value close to zero.

The adjust-bit determining circuit requires two groups of circuits for DSV computation: the circuits 52, 54 and 56 for performing DSV computation based on data having a "1" previously recorded in the adjust bit 81a, and the circuits 53, 55 and 57 for performing DSV computation based on data having a "0" previously recorded in the adjust bit 81a. This structure for an adjust-bit determining circuit is large in scale, and results in increased consumed power and cost.

Further, the encoder 51 converts input user data to an output data length which is 1.5 times greater than the input data in order to convert the user data to RLL (1, 7) codes. The encoder 51 therefore must output data to the adjust-bit inserting circuits 52 and 53 at a faster rate than the rate of the input user data. That is, the adjust-bit inserting circuits 52 and 53, the modulators 54 and 55 and the counters 56 and 57 must operate at a clock having a 1.5 times higher frequency. The consumed power of the adjust-bit determining circuit therefore increases because of the higher operation frequency.

Accordingly, it is desirable to reduce the consumed power and the circuit scale of an apparatus which records data in this PWM system.

SUMMARY OF THE INVENTION

Broadly speaking, the present invention relates to a method and circuit of determining the adjust bit of write data which allows the consumed power and the circuit scale to be reduced.

In one embodiment of the invention, an adjust bit value for a block of write data is determined. A recording medium for a computer, such as an optical disk, hard disk or the like contains sectors, each of which represents a data section of data that has originally been supplied by a user. Each of these data sections contains a plurality of blocks of write data. As the user data is sent to the recording medium from the memory of the computer, the invention operates to determine this adjust bit for a block of the write data. First, code conversion is performed upon the user data. Secondly, pulse width modulation (PWM) is performed upon the converted user data in order to produce the write data which will be written to the recording medium. The adjust bit for each block of write data is determined as this data is being written. An analysis of DSV (Digital Sum Value) values for the write data is used to determine the adjust bit value such that the sum of the DC levels for the write data at a given point is equal to zero or approaches zero. This determination of the adjust bit value may be performed in the following manner. DSV values for each block are continuously computed as the data is being written. These block DSV values are continuously accumulated to produce a temporary DSV value for the sector at that point. This temporary sector DSV value represents a DSV value from the head block of the data section up to the current block which is being processed. Next, the temporary sector DSV value is compared to the DSV value for the next block to be processed (the block sequentially after the current block). The adjust bit is now determined such that the now sector DSV value obtained by adding the temporary sector DSV value to the next block DSV value is zero or approaches zero.

In another embodiment of the invention, an adjust bit determining circuit determines the adjust bit for a block of the write data. This circuit includes an encoder for receiving user data two bits at a time. The encoder outputs DSV values for the 2-bit user data. A first circuit group for accumulating the DSV values from the encoder is used to acquire block DSV values of data belonging to the plurality of blocks of the data section. The first circuit group is controlled by a control circuit. A second circuit group accumulates these block DSV values computed by the first circuit group, and calculates a temporary sector DSV value as described above. The second circuit group is also controlled by the control circuit. A determining circuit is coupled to the first and second circuit groups for comparing the sector DSV value with a block DSV value for a next block following the current block. The determining circuit determines an adjust bit value for the next block in such a manner that a new sector DSV value obtained by adding the temporary sector DSV value to the block DSV value of the next block approaches zero.

This adjust bit determining circuit may also be embodied within a write-data preparing circuit which may be part of a disk controller that controls input and output to and from an optical disk, hard disk or the like. Preferably, DSV values are determined from the user data two bits at a time, and a conversion table is used to convert the data to RLL(1, 7) codes and from there to generate the DSV values.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description of the presently preferred embodiments together with the accompanying drawings in which.

DETAILED DESCRIPTION OF THE PREFERRED EMBODIMENTS

One embodiment of the present invention will be now described with reference to FIGS. 3 through 7.

Figure 1:
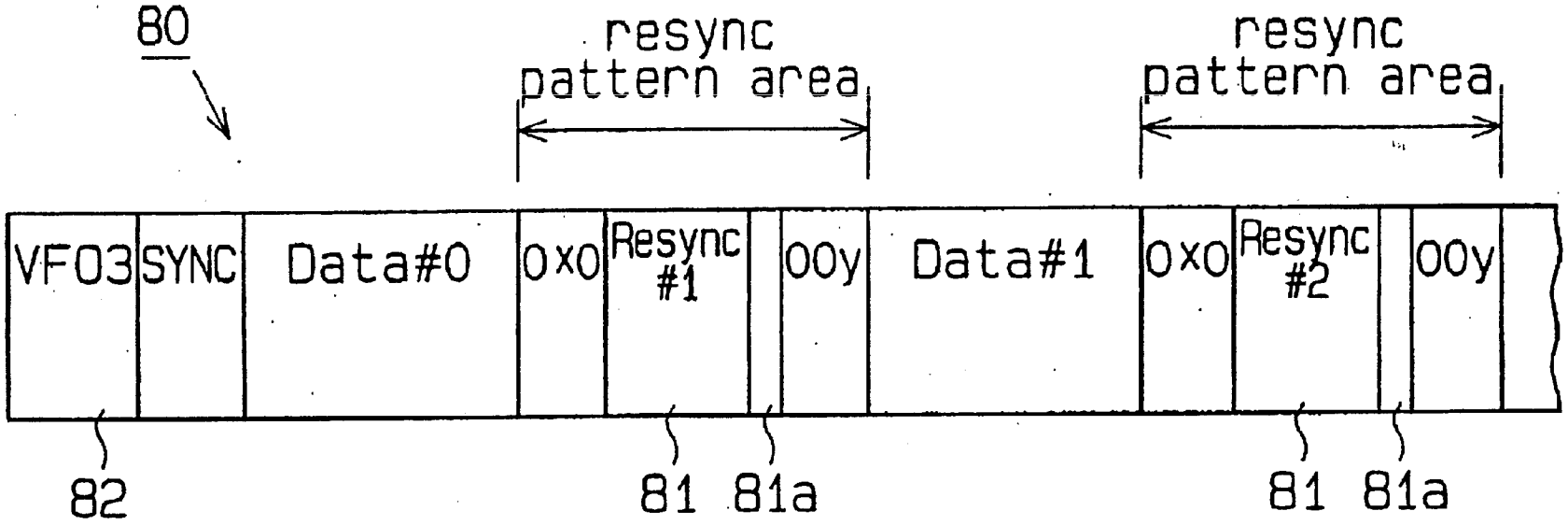
FIG. 1 is a schematic diagram showing the recording format of a data section in a recording medium.
Figure 2:
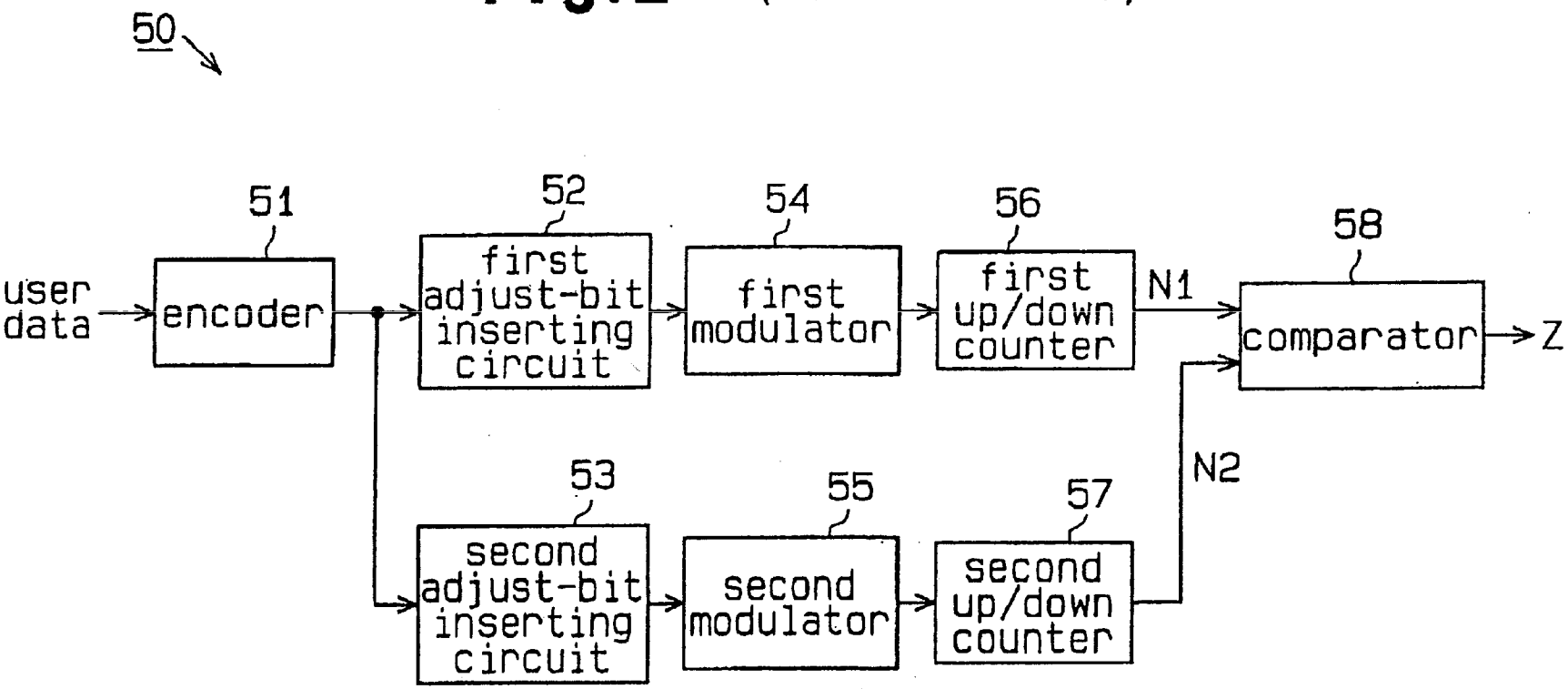
Fig.2 (Prior Art)
FIG. 2 is a block circuit diagram of a conventional adjust-bit determining circuit.
Figure 3:
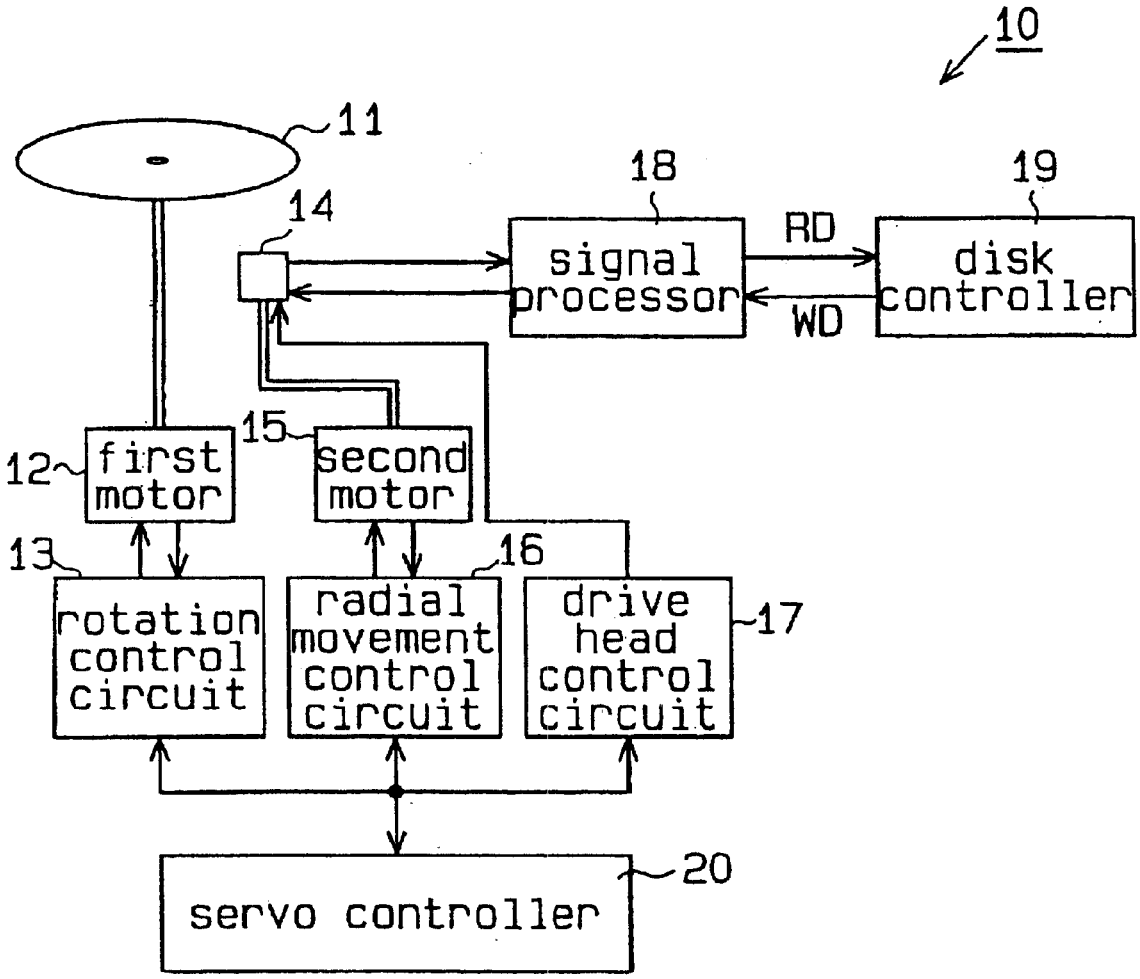
FIG. 3 is a block diagram showing the basic structure of an optical disk apparatus according to one embodiment of the present invention.

FIG. 3 shows the structure of an optical disk apparatus 10, which writes data on an optical disk 11 recording medium and reads recorded data therefrom. Data is recorded using the PWM system on the optical disk 11 by this optical disk apparatus.

The optical disk 11 is rotated by a first motor 12 under the control of a rotation control circuit 13. A drive head 14 is driven by a second motor 15 to move in the radial direction of the optical disk 11. The second motor 15 is controlled by a radial movement control circuit 16. The drive head 14 includes an optical pickup which writes data on the optical disk 11 and reads recorded data therefrom. A drive head control circuit 17 controls the drive head 14 in order to write data on and read data from the optical disk 11. The drive head 14 outputs data, read from the optical disk 11, to a disk controller 19 via a signal processor 18.

The disk controller 19 demodulates the read data in the PWM format to data in the PPM format, and outputs the resultant data as read data RD. The disk controller 19 modulates user data to accomplish modulation conversion from PPM to PWM to prepare write data WD. The disk controller 19 sends the write data WD to the drive head 14 via the signal processor 18. The drive head 14 records the PWM write data WD on the optical disk 11.

A servo controller 20 outputs various kinds of control signals to the control circuits 13, 16 and 17 to cause the drive head 14 to seek a track to which a target sector for data writing or data reading belongs; and also to set the number of rotations of the optical disk 11.

Figure 4:
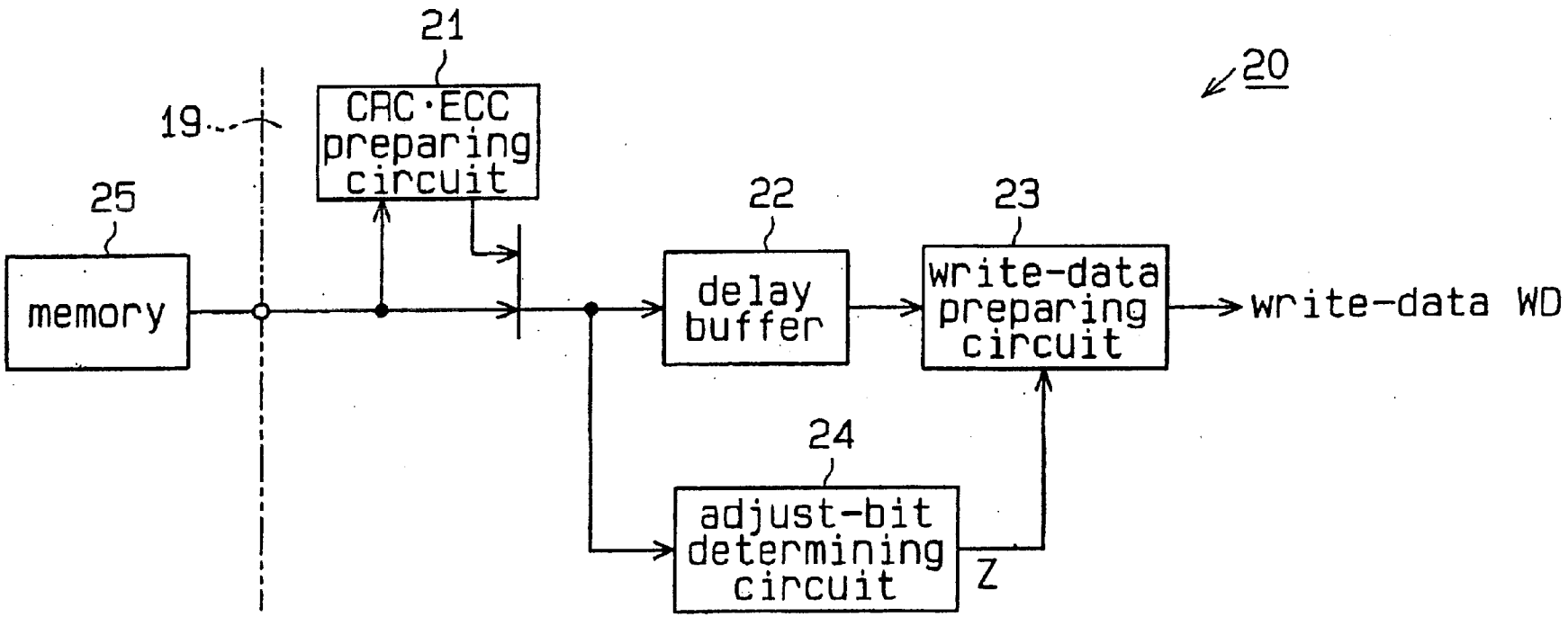
FIG. 4 shows a block diagram of a circuit for preparing write data.

FIG. 4 shows a circuit 20 provided in the disk controller 19 to prepare write data WD. The circuit 20 for producing write data WD comprises a CRC.ECC preparing circuit 21, a delay buffer 22, a write-data preparing circuit 23 and an adjust-bit determining circuit 24.

The CRC.ECC preparing circuit 21 receives user data to be written on the optical disk 11 from an external memory 25. The CRC.ECC preparing circuit 21 prepares an error check code or a cyclic redundancy code (CRC) and an error correction code (ECC) sector by sector. The delay buffer 22 also sequentially receives one sector of user data from the external memory 25. The delay buffer 22 receives the CRC and ECC prepared by the CRC.ECC preparing circuit 21 corresponding to the one sector of user data received from the external memory 25. The delay buffer 22 delays the user data by a predetermined amount of time and outputs the delayed user data to the write-data preparing circuit 23.

Created in the write-data preparing circuit 23 are a third lockup pattern (VFO), a sync pattern, a resync pattern and a postamble (PA). The write-data preparing circuit 23 modulates these pieces of data and the user data in the PPM format to data in the PWM format in order to prepare write data WD.

Figure 6:
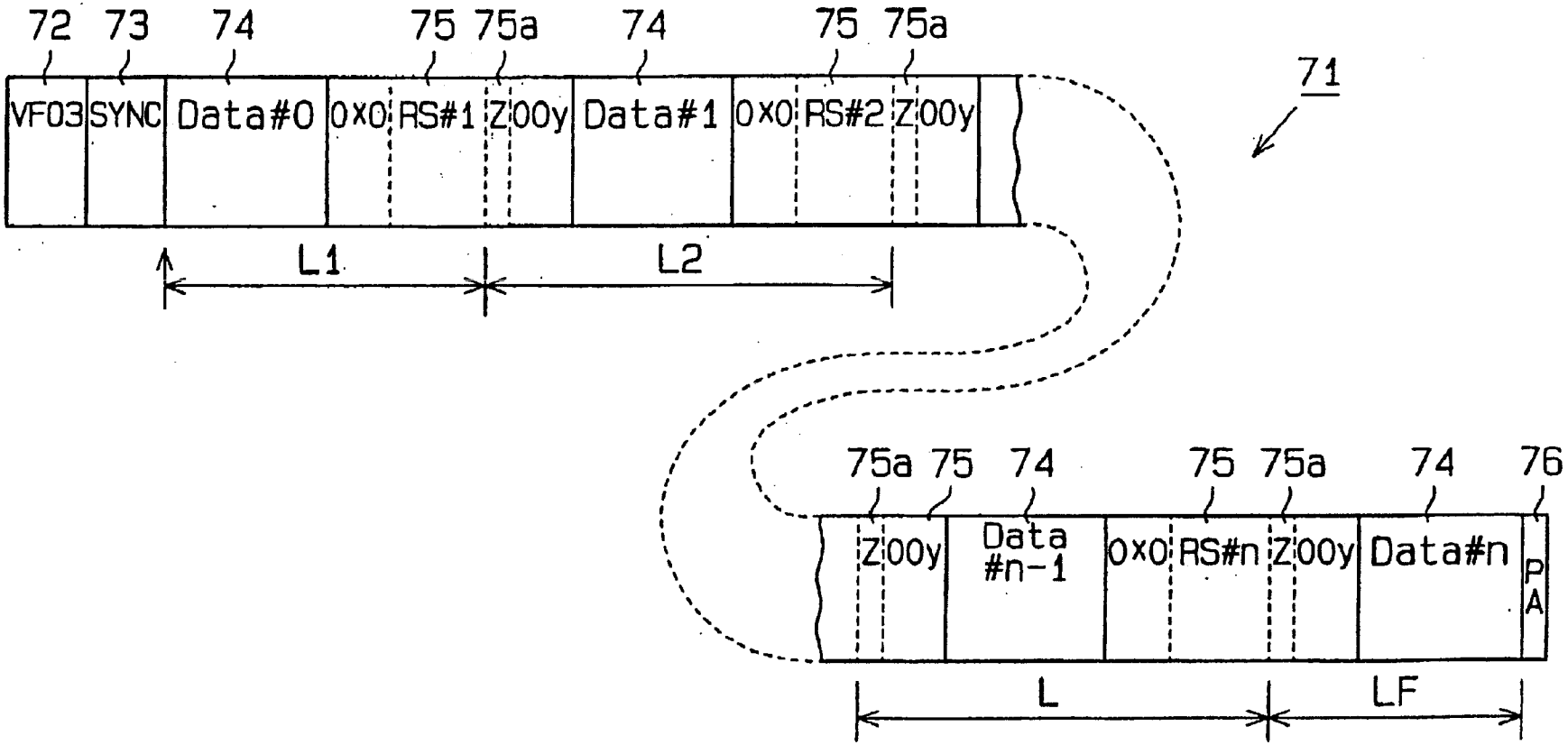
FIG. 6 is a schematic diagram showing the recording format after RLL (1, 7) code conversion.

As shown in FIG. 6, prior to the modulation the write-data preparing circuit 23 forms a data section 71 for one sector by creating the following areas in order: a third lockup pattern area 72 (VFO3), a sync pattern area 73, alternately-arranged user data areas 74 and resync pattern areas 75, and a postamble (PA) area 76 at the end. The write-data preparing circuit 23 converts data in the data section 71 to RLL (1, 7) codes in rotation. FIG. 6 schematically shows the recording format of the data section 71 in each sector. At the time of converting data in the data section 71 to RLL (1, 7) codes, the write-data preparing circuit 23 writes the bit value of an adjust bit 75a assigned to each resync pattern area 75 based on the select signal Z from the adjust-bit determining circuit 24. The write-data preparing circuit 23 modulates the converted RLL (1, 7) codes in the PPM format to the PWM format, and outputs the resultant data as write data WD. This write data WD is bit-adjusted data whose DC levels are zero or very close to zero.

The adjust-bit determining circuit 24 sequentially receives one sector of user data from the external memory 25. The adjust-bit determining circuit 24 receives the CRC and ECC, prepared by the CRC.ECC preparing circuit 21 corresponding to the one sector of user data received from the external memory 25. Prepared in the adjust-bit determining circuit 24 are data to be recorded in the third lockup pattern (VFO) area, sync pattern area, resync pattern area and postamble (PA) area. The adjust-bit determining circuit 24 executes DSV computation using those pieces of prepared data and the user data to determine the value of the adjust bit 75a in each resync pattern area 75, and outputs the bit value as the select signal Z to the write-data preparing circuit 23.

The adjust-bit determining circuit 24 should determine the value of the adjust bit 75a in each resync pattern area 75 of the data section 71 before the write-data preparing circuit 23 PWM-modulates on this adjust bit 75a. According to this embodiment, therefore, the delay buffer 22 is provided in the previous stage of the write-data preparing circuit 23.

Figure 7:
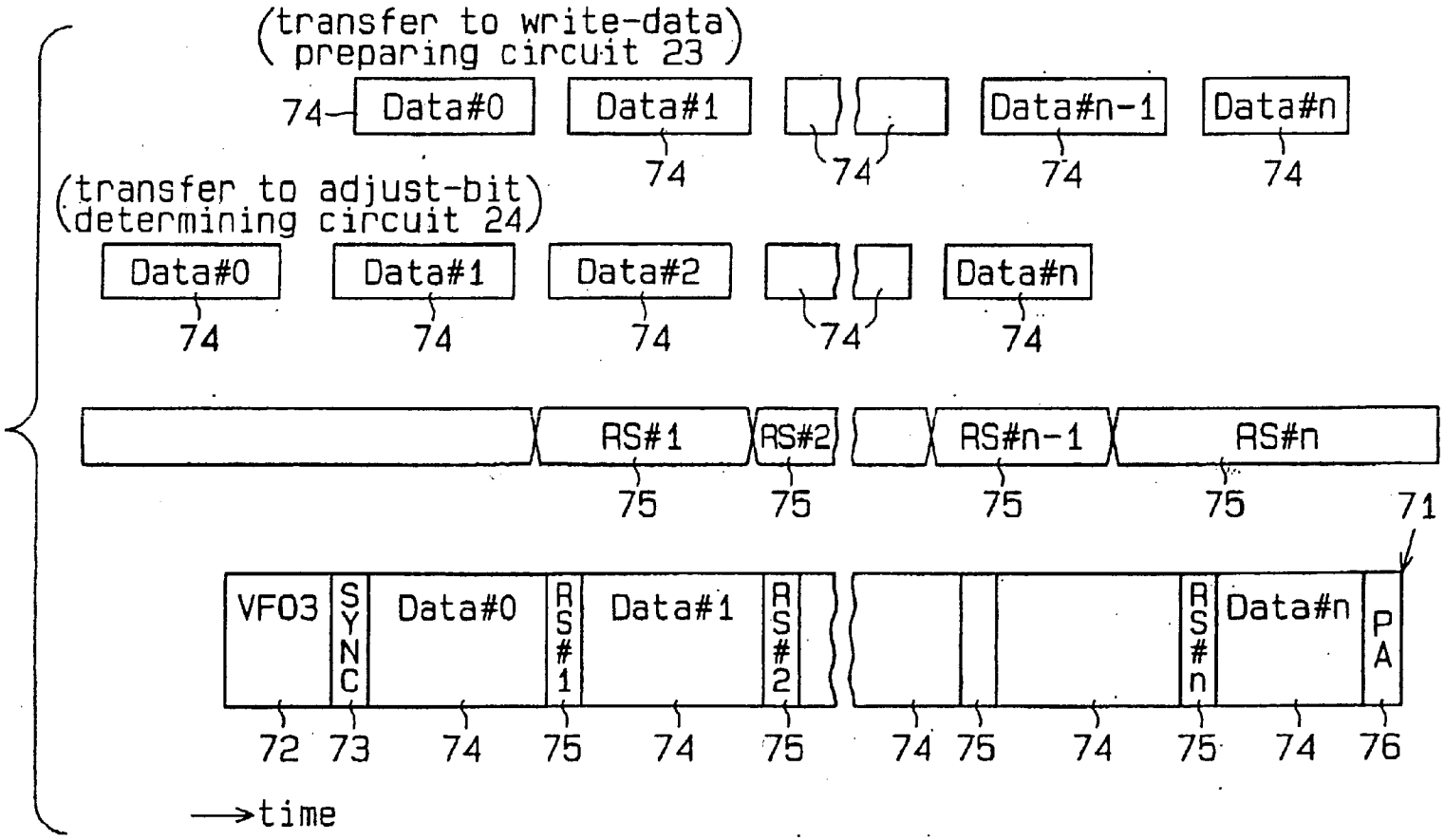
FIG. 7 is a diagram for explaining the transfer timing of user data.

FIG. 7 schematically shows the transfer of user data to be recorded in each user data area 74. User data input to the write-data preparing circuit 23 is delayed relative to user data input to circuit 24. For example, when the adjust-bit determining circuit 24 receives user data which is to be recorded in the second user data area 74, inputting of user data to the write-data preparing circuit 23 to be recorded in the first user data area 74 starts with a small delay. This delayed input of user data to the write-data preparing circuit 23 allows the adjust-bit determining circuit 24 to determine the bit value of the adjust bit 75a prior to the PWM.

Figure 5:
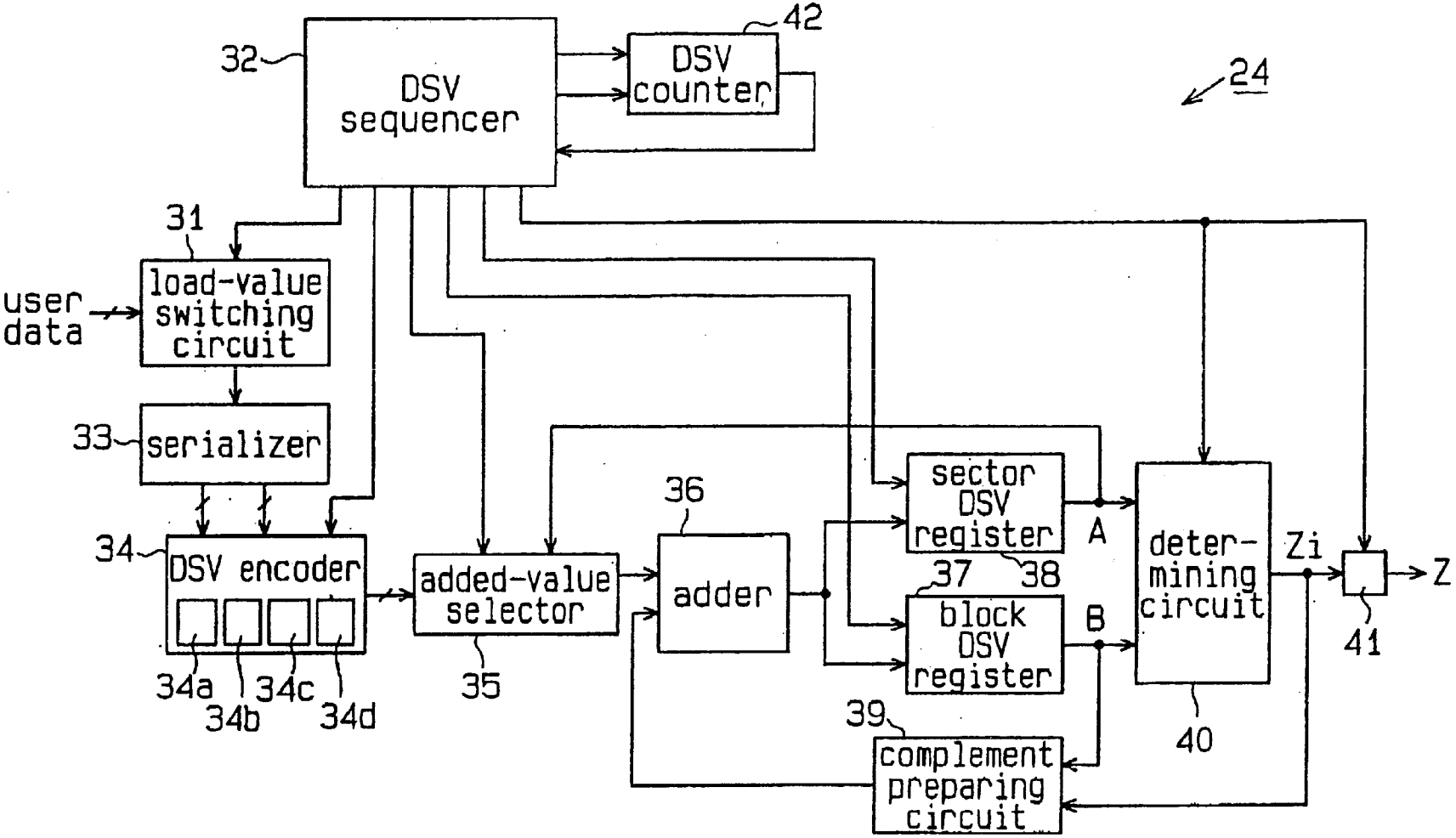
FIG. 5 is a block diagram of an adjust-bit determining circuit according to one embodiment of the present invention.

FIG. 5 shows an embodiment for the circuit of the adjust-bit determining circuit 24. A load-value switching circuit 31 receives user data from the external memory 25 and/or the CRC.ECC preparing circuit 21. The load-value switching circuit 31 receives a part (last two bits) of sync pattern data and a part (first two bits and last two bits) of resync pattern data from a DSV sequencer 32 as the first and second control circuits. The load-value switching circuit 31 outputs user data, a part of the sync pattern data and a part of the resync pattern data, eight bits at a time, to a serializer 33 in the order according to the format. The serializer 33 separates the 8-bit input data to 2-bit data and sends the 2-bit data to a DSV encoder 34 from two output terminals. One of the two outputs is a 2-bit input bit to be converted, and the other one is a subsequent 2-bit input bit. P The DSV encoder 34 performs DSV computation based on the input data, that is, the user data before the conversion to RLL (1, 7) codes. The DSV computation is carried out in units of 2-bit data (input data) prior to the conversion to RLL (1, 7) codes.

The 2-bit data (input bits), when converted to RLL (1, 7) codes, become 3-bit data (channel bit). This 3-bit channel bit is determined based upon the value of the target two input bits, the value of one previous bit to the input bits (the bit value of the converted channel bit) and the values of one and two succeeding bits from the input bits (the bit value of the following two input bits).

Even if the input bits are "0, 0", the channel bit may become "0, 0, 0", "0, 0, 1" or "0, 1, 0" depending on the state of one previous channel bit and the state of one succeeding input bit. Even if the input bits are "1, 1" or "0, 1", the channel bit may become "0, 1, 0" depending on the state of one previous channel bit and the states of two succeeding bits. With regard to the four types of input bits "0, 0", "0, 1", "1, 0" and "1, 1", there are five possible kinds of channel bits, "0, 0, 0", "0, 0, 1", "0, 1, 0", "1, 0, 1" and "1, 0, 0".

The DSV encoder 34 has a conversion table 34a for those five kinds of channel bits with respect to the four kinds of input bits, and a register 34b for storing the value of one previous channel bit. Thus, the DSV encoder 34 converts 2-bit user data (input bits) from the serializer 33 to a 3-bit channel bit using the conversion table 34a, the register 34b and subsequent 2-bit data coming from the serializer 33.

The DSV encoder 34 further has a PWM value register 34c for storing the signal level when channel-bit converted data is PWM-modulated. This PWM value register 34c inverts the stored value when the channel-bit converted data contains two "1"'s.

The DSV encoder 34 performs DSV computation on the 3-bit channel bit as follows.

The 3-bit channel bit will take one the aforementioned five kinds of values. The DSV values of those five channel bits are determined by the state, i.e., high ("1") or low ("0"), of the value in the PWM value register 34c.

When the channel bit is "0, 0, 0" and the state of the register 34c is high, the DSV value becomes "+3". When the channel bits is "0, 0, 0" and the state of the register 34c is low, the DSV value becomes "−3".

When the channel bit is "0, 0, 1" and the state of the register 34c is high, the DSV value becomes "+1". When the channel bit is "0, 0, 1" and the state of the register 34c is low, the DSV value becomes −"1".

When the channel bit is "0, 1, 0" and the state of the register 34c is high, the DSV value becomes "−1". When the channel bit is "0, 1, 0" and the state of the register 34c is low, the DSV value becomes "+1".

When the channel bit is "1, 0, 1" and the state of the register 34c is high, the DSV value becomes "−1". When the channel bit is "1, 0, 1" and the state of the register 34c is low, the DSV value becomes "+1".

When the channel bit is "1, 0, 0" and the state of the register 34c is high, the DSV value becomes "−3". When the channel bit is "1, 0, 0" and the state of the register 34c is low, the DSV value becomes "+3".

As is apparent from the above, once the value of a 3-bit channel bit and the state of the PWM value register 34c are known, the DSV values of this channel bit may be determined.

The DSV encoder 34 also has a DSV-value conversion table 34d for DSV values corresponding to the five kinds of channel bits and the state of the PWM value register 34c.

The DSV encoder 34 outputs the DSV value obtained from the DSV-value conversion table 34d to an added-value selector 35. This DSV value is 2-bit data. This is because there are only four DSV values available, "+3", "+1", "−1" and "−3", corresponding to the five 3-bit channel bits and the state of the PWM value register 34c.

The DSV encoder 34 receives a fixed-value select signal indicating a part of the resync pattern data (intermediate data excluding the first two bits and the last two bits) from the DSV sequencer 32. This part of the resync pattern data is a predetermined fixed pattern and the adjust bit is "0".

Therefore, the DSV value for this fixed pattern is specifically determined by the level of the immediately previous PWM signal or the state of the PWM value register 34c. The DSV value for the fixed pattern with the adjust bit preset to "0" is "+3" or "−3". Immediately upon reception of the fixed-value select signal from the DSV sequencer 32, the DSV encoder 34 outputs the DSV value of "+3" or "−3" to the added-value selector 35 depending on the state of the PWM value register 34c. The DSV encoder 34 then inverts the content of the PWM value register 34c because there are three "1"'s included in the fixed pattern.

The added-value selector 35 receives a select signal and a first initial DSV value from the DSV sequencer 32. The added-value selector 35 also receives a DSV value from a sector DSV register 38. Based on the select signal, the added-value selector 35 selects either the DSV encoder 34 or the sector DSV register 38. When selecting the DSV encoder 34, the added-value selector 35 sequentially outputs the DSV values from the DSV encoder 34 to an adder 36. When selecting the sector DSV register 38, the added-value selector 35 outputs the DSV value from the sector DSV register 38 to the adder 36.

With the DSV encoder 34 selected, when receiving the first initial DSV value from the DSV sequencer 32, the added-value selector 35 outputs this initial value to the adder 36. The first initial DSV value from the DSV sequencer 32 consists of the third lockup pattern and sync pattern (excluding the last two bits) of the data section 71, shown in FIG. 6. At the third lockup pattern and sync pattern (excluding the last two bits) are predetermined patterns, they always have the same data value even after PWM. As a result, the DSV value becomes a fixed value. The DSV value of the third lockup pattern is "0" and the DSV value of the sync pattern is "+9".

The adder 36 adds the DSV value from the added-value selector 35 and a DSV value from a block DSV register 37, which comes through a complement preparing circuit 39. The adder 36 outputs the resultant value to both registers 37 and 38. These registers 37 and 38 are designed to receive and hold the added value from the adder 36 based on a control signal from the DSV sequencer 32.

The block DSV register 37 retains DSV values for a plurality of predetermined blocks L of the data section 71. Each block L indicates a predetermined length in the data section 71, as shown in FIG. 6. Each of those blocks L, excluding the first block L1 and the last block LF, indicates a range from the adjust bit 75a of one resync pattern area 75 to just before the adjust bit 75a of the next resync pattern area 75. The first block L1 ranges from the first data area 74 to just before the adjust bit 75a of the first resync pattern area 75. The last block LF ranges from the adjust bit 75a of the last resync pattern area 75 to just before the postamble area 76.

The block DSV register 37 outputs an occasional DSV value to the adder 36 via the complement preparing circuit 39. The complement preparing circuit 39 determines whether or not the 2's complement of the DSV value retained in the block DSV register 37 should be acquired, based on the output signal Zi from a determining circuit 40. More specifically, when the output signal Zi of the determining circuit 40 is "0", the complement preparing circuit 39 directly outputs the DSV value in the block DSV register 37 to the adder 36 without obtaining the 2's complement. When the output signal Zi of the determining circuit 40 is "1", on the other hand, the complement preparing circuit 39 calculates the 2's complement of the DSV value in the block DSV register 37 and outputs the complement value to the adder 36. While the DSV value for each block L is being computed, the determining circuit 40 is outputting the output signal Zi of "0". Therefore, the adder 36 adds the DSV value from the DSV encoder 34 and the accumulated DSV values over a range up to block LN from the block DSV register 37 via the added-value selector 35 to obtain the DSV value in the next block LN+1. As this addition is repeated, the block DSV register 37 holds the DSV values B for a predetermined block LN+1(hereinafter called "block DSV value"). The computation of this block DSV value B is performed by controlling the added-value selector 35, the adder 36, the block DSV register 37, the complement preparing circuit 39 and the determining circuit 40 based on the control signals from the DSV sequencer 32.

The circuits 35, 36, 37, 39 and 40 are controlled based on the control signals from the DSV sequencer 32 and constitute a first group of circuits which performs the computation of block DSV values B.

The sector DSV register 38 holds DSV values from the head of the data section 71 (third lockup pattern). The sector DSV register 38 outputs the retained DSV values to the adder 36 via the added-value selector 35. The adder 36 adds the DSV value from the sector DSV register 38 and the block DSV value B in a next block from the block DSV register 37 to acquire the accumulated value of the DSV values A over a range from the head of the data section 71 to the next block LN+1 (hereinafter called "sector DSV value"). The sector DSV register 38 retains the sector DSV value A from the head of the data section 71 to that next block LN+1. The computation of the sector DSV value A from the head is performed by controlling the added-value selector 35, the adder 36, the registers 37 and 38, the complement preparing circuit 39, the determining circuit 40 based on the control signals from the DSV sequencer 32.

The circuits 35, 36, 37, 38, 39 and 40 are controlled based on the control signals from the DSV sequencer 32 and constitute a second group of circuits which performs the computation of the sector DSV value A from the head of the data section 71 to the next block LN+1.

The determining circuit 40 receives the block DSV value B from the block DSV register 37 and the sector DSV value A from the sector DSV register 38 and compares the sector DSV value A with the block DSV value B to determine the value of the adjust bit 75a of each resync pattern area 75. The determining circuit 40 outputs the output signal Zi to a flip-flop circuit 41 based on the comparison result. When the comparison result indicates that the adjust bit 75a belonging to the current block LN+1 for which the block DSV register 37 holds the block DSV value B should be a "1", the determining circuit 40 outputs the output signal Zi of "1". When the comparison result indicates that the adjust bit 75a belonging to the current block LN+1 for which the block DSV register 37 holds the block DSV value B should be a "0", the determining circuit 40 outputs the output signal Zi of "0".

More specifically, when the sector DSV value A is "0" and the block DSV value B is positive or negative, the determining circuit 40 outputs the output signal Zi of "0". This means that when the sector DSV value A is "0", the adjust bit 75a should be set to "0" regardless of whether the block DSV value B is positive or negative. When the sector DSV value A over a range up to a previous block LN is "0" and the block DSV value B of the next block LN+1 is positive or negative, the absolute value of the sector DSV value A over a range up to the next block LN+1 does not change regardless of whether the adjust bit 75a belonging to that next block LN+1 is set to "0" or "1". Accordingly, the determining circuit 40 outputs the output signal Zi of "0".

When the block DSV value B is "0" and the sector DSV value A is positive or negative, the determining circuit 40 outputs the output signal Zi of "0" This means that when the block DSV value B is "0", the adjust bit 75a should be set to "0" regardless of whether the sector DSV value A is positive or negative. When the block DSV value B for the next block LN+1 is "0" when the adjust bit 75a is "0", even if the sector DSV value A over a range up to the previous block LN is added, the sector DSV value A over a range up to the next block LN+1 does not change. Accordingly, the determining circuit 40 outputs the output signal Zi of "0".

When the sector DSV value A and the block DSV value B are both positive, the determining circuit 40 outputs the output signal Zi of "1". This means that when both DSV values A and B are positive, the adjust bit 75a should be set to "1". When the sector DSV value A over a range up to the previous block LN is positive and the block DSV value B for the next block LN+1 is also positive when the adjust bit 75a is "0", if the adjust bit 75a is set to "0", the sector DSV value A over a range up to the new block LN+1 becomes a greater positive value. This is because the block DSV value B has been acquired through the DSV computation premised on the value of the adjust bit 75a being "0". To make the sector DSV value A over a range up to the next block LN+1 approach "0", therefore, the DSV computation premised on that the value of the adjust bit 75a belonging to the next block LN+1 is "1" should be performed. By this DSV computation, the block DSV value B becomes negative and the sector DSV value A over a range up to the next block LN+1 becomes closer to "0". Accordingly, the determining circuit 40 outputs the output signal Zi of "1".

When the sector DSV value A is positive and the block DSV value B is negative, the determining circuit 40 outputs the output signal Zi of "0". This means that the adjust bit 75a becomes "0". When the sector DSV value A over a range up to the previous block LN is positive and the block DSV value B for the next block LN+1 is negative when the adjust bit 75a is "0", if the adjust bit 75a belonging to the next block LN+1 is set to "0", the sector DSV value A over a range up to the next block LN+1 approaches "0". Accordingly, the determining circuit 40 outputs the output signal Zi of "0".

When the sector DSV value A is negative and the block DSV value B is positive, the determining circuit 40 outputs the output signal Zi of "0" This means that the adjust bit 75a becomes "0". When the sector DSV value A over a range up to the previous block LN is negative and the block DSV value B for the new block LN+1 is positive when the adjust bit 75a is "0", if the adjust bit 75a belonging to that new block LN+1 is set to "0", the sector DSV value A over a range to the new block LN+1 approaches "0". Accordingly, the determining circuit 40 outputs the output signal Zi of "0".

When the sector DSV value A and the block DSV value B are both negative, the determining circuit 40 outputs the output signal Zi of "1" This means that the adjust bit 75a becomes "1" When the sector DSV value A over a range up to the previous block LN is negative and the block DSV value B for the next block is also negative when the adjust bit 75a is "0", if the adjust bit 75a is set to "0", the sector DSV value A over a range up to the next block LN+1 becomes a greater positive value. This is because that the block DSV value B has been acquired through the DSV computation premised on the value of the adjust bit 75a being "0". To make the sector DSV value A over a range up to the new block LN+1 approach "0", therefore, the DSV computation premised on the value of the adjust bit 75a belonging to the next block LN+1 being "1" should be performed. By this DSV computation, the block DSV value B becomes negative and the sector DSV value A over a range up to the next block LN+1 becomes closer to "0". As a result, the determining circuit 40 outputs the output signal Zi of "1".

The determining circuit 40 performs this comparison based on the control signal from the DSV sequencer 32 and outputs the output signal Zi to the complement preparing circuit 39 and the flip-flop 41. When performing no comparison operation, the determining circuit 40 outputs the output signal Zi to the complement preparing circuit 39 based on the control signal from the DSV sequencer 32. Based on the output signal Zi of "0", the complement preparing circuit 39 outputs the occasional DSV value and the block DSV value B from the block DSV register 37 to the adder 36. Based on the output signal Zi of "1", the complement preparing circuit 39 calculates the 2's complement of the block DSV value B from the block DSV register 37 and outputs the complement value to the adder 36.

The flip-flop 41 retains the output signal Zi based on the comparison performed by the determining circuit 40 and outputs the output signal Zi as the select signal Z to the write-data preparing circuit 23. The holding and outputting operations of the flip-flop 41 are performed based on the control signals from the DSV sequencer 32.

The DSV sequencer 32 is connected to a DSV counter 42. The DSV sequencer 32 outputs a control Signal to control the DSV counter 42 and an initial value for that counter 42. The DSV counter 42 counts by bits the bit position in the data section 71 for which the DSV encoder 34 performs the DSV computation. Based on the count value from the DSV counter 42, the DSV sequencer 32 determines which bit position in which block L the DSV encoder 34 is performing its process. Based on the count value from the DSV counter 42, the DSV sequencer 32 outputs a control signal for obtaining the value of the adjust bit 75a of each resync pattern area 75 to each of the individual circuits 31 to 41.

The operation of the adjust-bit determining circuit 24 will be now described.

The disk controller 19 receives user data stored in the external memory 25 which is to be recorded on the optical disk 11. The adjust-bit determining circuit 24, the delay buffer 22 and the CRC.ECC preparing circuit 21, receive this user data. Upon reception of the user data, the CRC.ECC preparing circuit 21 prepares the CRC and ECC for each sector and outputs them as user data to the adjust-bit determining circuit 24 and the delay buffer 22.

The DSV sequencer 32 in the adjust-bit determining circuit 24 performs an operation for determining the value of the adjust bit based on the sequentially input user data. The DSV sequencer 32 sets the contents of the registers 34b and 34c of the DSV encoder 34, the block DSV register 37, the sector DSV register 38 and the flip-flop 41 to "0". Subsequently, the DSV sequencer 32 outputs the first initial DSV value to the block DSV register 37 via the added-value selector 35 and the adder 36 in response to a gate-ON signal from an unillustrated main CPU in the disk controller 19. As shown in FIG. 6, the first initial DSV value is what has been previously obtained from the data stored in the lockup pattern area 72 in the data section 71 and from the data in the sync pattern area 73 (excluding data of the last 3-bit channel bit). The previously obtained DSV value in this case is "+9". Because the DSV value is known beforehand at this point of time, the DSV sequencer 32 does not need to perform the computation of the DSV value from the data to be recorded in the lockup pattern area 72 and the data to be recorded in the sync pattern area 73 by using the load-value switching circuit 31, the serializer 33 and the DSV encoder 34. Therefore, the block DSV register 37 retains the DSV value of the head data in the data section 71.

The DSV sequencer 32 sets the initial value in the DSV counter 42. This initial value is the bit length of the data before RLL (1, 7) code conversion from the last two bits of the sync pattern area 73 up to the first two bits of the resync pattern area 75 in the data section 71. That is, the DSV counter 42 starts decrementing from this initial value in order to measure from which bit the DSV computation should be carried out.

The DSV sequencer 32 sets value in the register 34b in the DSV encoder 34 to "1" in order to set the state of the fourth channel bit from the end of the sync pattern data.

When this initialization is completed, the DSV sequencer 32 computes the block DSV value for the first block L1.

After sending 2-bit data (before RLL (1, 7) code conversion) following the sync pattern data to the load-value switching circuit 31, the DSV sequencer 32 sets the switching circuit 31 to receive user data. The reason why the 2-bit data following the sync pattern data is input to the load-value switching circuit 31 is that when those two bits are converted to RLL (1, 7) codes by the value of the subsequent two bits, the 3-bit channel bit after the RLL (1, 7) code conversion changes. The load-value switching circuit 31 first outputs the last 2-bit data of the sync pattern data and then the user data to the serializer 33.

The serializer 33 outputs data (input bits) two bits at a time to the DSV encoder 34. The DSV encoder 34 converts the input bits to a 3-bit channel bit using the contents of the conversion table 34a and the register 34b. The DSV encoder 34 acquires the DSV values of the 3-bit channel bit using the contents of the DSV-value conversion table 34d and the register 34c.

The DSV values are acquired by executing the DSV computation on every two bits of the data which is to be recorded in the user data area 74 in the first block L1. The DSV encoder 34 sequentially outputs the DSV value to the added-value selector 35. The added-value selector 35 outputs the DSV values from the DSV encoder 34 to the adder 36 based on the control signal from the DSV sequencer 32. Every time the DSV value is received from the added-value selector 35, the adder 36 adds this DSV value to the DSV value retained in the block DSV register 37 and resets the resultant value back in the block DSV register 37. Because the output signal Zi of the determining circuit 40 is held to "0" by the DSV sequencer 32 at this point in time, the complement preparing circuit 39 outputs the DSV value from the block DSV register 37 directly to the adder 36.

Every time the input bits are converted to a DSV value, the value in the DSV counter 42 is decremented. When the value in the DSV counter 42 becomes "1", i.e., when the computation of the DSV values for the user data area 74 in the first block L1 is completed, the DSV sequencer 32 outputs the first two bits of the resync pattern data to the load-value switching circuit 31, and causes the DSV encoder 34 to acquire the DSV value of those two bits. Subsequently, the DSV encoder 34 outputs the DSV value of the first two bits of the resync pattern data to the adder 36 via the added-value selector 35. The adder 36 adds this DSV value of the first two bits and the DSV values for the first user data area 74 from the head of the data section 71, which are retained in the block DSV register 37.

When the value of the DSV counter 42 becomes "0", the DSV sequencer 32 outputs the fixed-value select signal to the DSV encoder 34 to obtain the DSV value of the resync pattern data excluding the first two bits and the last two bits of the resync pattern data. In response to the fixed-value select signal, the DSV encoder 34 immediately selects the value "+3" or "−3" depending on the state of the register 34c, and outputs that value to the adder 36. Therefore, the block DSV register 37 retains the DSV values from the head to just before the adjust bit 75a of the first resync pattern area 75.

When the block DSV value B of the first block L1 (which may include the DSV values of the lockup pattern area 72 and the sync pattern area 73) is acquired, the DSV sequencer 32 causes the adder 36 to add the sector DSV value A held in the sector DSV register 38 and the block DSV value B held in the block DSV register 37. The adder 36 then outputs the resultant value as a new sector DSV value A to the sector DSV register 38.

As the sector DSV register 38 is initialized to "0" at this point in time, this new sector DSV value A to be held there is the block DSV value B. The sector DSV register 38 therefore retains the sector DSV value A from the head to just before the adjust bit 75a of the first resync pattern area 75.

For the DSV computation for the first block L1, the DSV sequencer 32 controls both registers 37 and 38 and the determining circuit 40 so that the determining circuit 40 does not compare the sector DSV value A with the block DSV value B.

Next, the DSV sequencer 32 sets the initial value of the DSV counter 42. This initial value is the bit length of the data from the last two bits of the previous first sync pattern area 75 to just before the last two bits of the next sync pattern area 75.

The DSV sequencer 32 sets the contents of register 34b of the DSV encoder 34 and the block DSV register 37 to "0". The reason for setting the content of register 34b to "0" is because the DSV computation is performed with the adjust bit 75a set to "0". In other words, the next bit to the adjust bit 75a (the last 3-bit channel bit of the resync pattern data or the 2-bit input bit before the RLL (1, 7) code conversion) is converted to an RLL (1, 7) code in the computation of the DSV value for the second block L2 based on the state of the adjust bit 75a.

Subsequently, the DSV sequencer 32 outputs the second initial DSV value to the block DSV register 37 via the DSV encoder 34, the added-value selector 35 and the adder 36. The second initial DSV value is equivalent to the DSV value of the adjust bit part, and becomes "−1" when the value in register 34c is "0" and becomes "+1" when the value in register 34c is "1".

When those initializations are completed, the DSV sequencer 32 executes the computation of the block DSV value for the second block L2.

After sending the last two bits of the resync pattern data (before RLL (1, 7) code conversion) to the load-value switching circuit 31, the DSV sequencer 32 sets the switching circuit 31 to receive user data. The reason for the inputting of the last two bits of the resync pattern data to the load-value switching circuit 31 is because when those two bits are converted to an RLL (1, 7) code by the subsequent one bit, the 3-bit channel bit changes. The load-value switching circuit 31 first outputs the last 2-bit data of the resync pattern data and then the user data to the serializer 33.

As mentioned earlier, the serializer 33 outputs data (input bits), two bits at a time to the DSV encoder 34. The DSV encoder 34 converts the input bits to a 3-bit channel bit using the contents of the conversion table 34a and the register 34b. As mentioned earlier, the DSV encoder 34 acquires the DSV values of the 3-bit channel bit using the contents of the DSV-value conversion table 34d and the register 34c. The DSV values are retained in the block DSV register 37 in the above-discussed manner.

When the value in the DSV counter 42 becomes "1", i.e., when the computation of the DSV values for the user data area 74 in the second block L2 is completed, the DSV sequencer 32 outputs the first two bits of the resync pattern data before RLL (1, 7) code conversion to the load-value switching circuit 31, and causes the DSV encoder 34 to acquire the DSV value of those two bits. Subsequently, the DSV encoder 34 outputs the DSV value of the first two bits of the resync pattern data to the adder 36 via the added-value selector 35. The adder 36 adds this DSV value for the first two bits and the DSV values for the user data area 74 in the second block L2 of the data section 71, which are retained in the block DSV register 37.

When the value of the DSV counter 42 becomes "0", the DSV sequencer 32 outputs the fixed-value select signal to the DSV encoder 34 as mentioned earlier. In response to the fixed-value select signal, the DSV encoder 34 immediately selects the value "+3" or "−3" from the immediately previous state, and outputs that value to the adder 36. Therefore, the block DSV register 37 retains the block DSV value B of the second block L2.

When the block DSV value B of the second block L2 is acquired, the DSV sequencer 32 initiates the comparing operation. In response to the control signal from the DSV sequencer 32, both registers 37 and 38 output their retained sector DSV value A and block DSV value B to the determining circuit 40. The determining circuit 40 compares the sector DSV value A with the block DSV value B.

When the sector DSV value A is "0" and the block DSV value B is positive or negative, the determining circuit 40 outputs the output signal Zi of "0". That is, because the sector DSV value A for the second block L2 is either positive or negative irrespective of whether the adjust bit 75a belonging to the second block L2 is set to "0" or "1", the determining circuit 40 outputs the output signal Zi of "0".

When the block DSV value B is "0" and the sector DSV value A is positive or negative, the determining circuit 40 outputs the output signal Zi of "0". This is because the block DSV value B for the second block L2 computed with the value of the adjust bit 75a being set to "0" means that even if the sector DSV value A for the second block L2 is added, the sector DSV value A for the second block L2 does not change.

When the sector DSV value A and the block DSV value B are both positive, the determining circuit 40 outputs the output signal Zi of "1". If the DSV computation is performed under the condition that the adjust bit 75a belonging to the second block L2 is "0", the sector DSV value A for the second block L2 becomes a greater positive value. To make the sector DSV value A for the second block L2 approach "0", therefore, the determining circuit 40 outputs the output signal Zi of "1".

When the sector DSV value A is positive and the block DSV value B is negative, the determining circuit 40 outputs the output signal Zi of "0". If the adjust bit 75a belonging to the second block L2 is set to "0", the sector DSV value A for the second block L2 approaches "0". In this case, therefore, the determining circuit 40 outputs the output signal Zi of "0". When the sector DSV value A is negative and the block DSV value B is positive, the determining circuit 40 outputs the output signal Zi of "0". If the adjust bit 75a belonging to the second block L2 is set to "0", the sector DSV value A for the second block L2 approaches "0". In this case, therefore, the determining circuit 40 outputs the output signal Zi of "0".

When the sector DSV value A and the block DSV value B are both negative, the determining circuit 40 outputs the output signal Zi of "1". If the adjust bit 75a belonging to the second block L2 is set to "0", the sector DSV value A for the second block L2 becomes a greater negative value. To make the sector DSV value A for the second block L2 approach "0", therefore, the determining circuit 40 outputs the output signal Zi of "1".

The determining circuit 40 outputs the output signal Zi as the select signal Z to the write-data preparing circuit 23 via the flip-flop 41. Based on this select signal Z, the write-data preparing circuit 23 writes the proper value in the adjust bit 75a of the first resync pattern area 75 in the data after the RLL (1, 7) code conversion of the user data input. This adjust bit 75a belongs to the second block L2. That is, when the select signal Z is "0", the adjust bit 75a becomes "0" When the select signal Z is "1", the adjust bit 75a becomes "1". The determining circuit 40 outputs the output signal Zi to the complement preparing circuit 39. The complement preparing circuit 39 outputs the block DSV value B from the block DSV register 37 to the adder 36 when the select signal Z is "0".

The complement preparing circuit 39 calculates the 2's complement of the block DSV value B from the block DSV register 37 and outputs this complement value to the adder 36 when the select signal Z is "1".

The added-value selector 35 outputs the sector DSV value A from the sector DSV register 38 to the adder 36 based on the control signal from the DSV sequencer 32. The adder 36 adds both values and outputs the resultant value to the sector DSV register 38. That is, when the select signal Z is "0", the adder 36 adds the block DSV value B held in the block DSV register 37 and the sector DSV value A in the sector DSV register 38. More specifically, the adder 36 calculates the sum of the DSV value B for the second block L2, acquired under the condition that the adjust bit 75a belonging to the second block L2 is "0", plus the sector DSV value A for the first block L1. The adder 36 then outputs this sum to the sector DSV register 38.

When the select signal Z is "1", the adder 36 adds the 2's complement of the block DSV value B retained in the block DSV register 37 and the sector DSV value A from the sector DSV register 38. This results in the subtraction of the block DSV value B from the sector DSV value A of the sector DSV register 38. The adder 36 then outputs this sum of the DSV value B for the second block L2 (acquired under the condition that the adjust bit 75a belonging to the second block L2 is "1") and the sector DSV value A for the first block L1, to the sector DSV register 38.

Therefore, the bit-adjusted sector DSV value A for the second block L2 from the head data in the data section 71, is retained the sector DSV register 38 in FIG. 6.

When the sector DSV value A for the second block L2 is acquired, the DSV sequencer 32 performs the initialization for the third block L3. In this case, when the adjust bit 75a for the second block L2 is "0", the same initialization as discussed earlier is performed. When the adjust bit 75a is "1", the corresponding state should be set in the register 34c. Although the computation of the DSV value for the second block L2 has been computed with the adjust bit 75a set to "0", when the adjust bit 75a becomes "1", the level of the PWM signal is inverted whether high or low. The content of the register 34a should therefore be inverted.

Thereafter, the DSV sequencer 32 executes similar processing to determine the values of the individual adjust bits 75a and to acquire the sector DSV value A until the last block LF is reached. As the resync pattern area 75 does not exist in the last block LF, the DSV sequencer 32 executes control to obtain the block DSV value B for the user data area 74 up to the postamble (PA) area 76. When the value of the adjust bit 75a belonging to the last block LF is determined, the adjust-bit determining circuit 24 has completed the bit adjusting process for one sector.

According to this embodiment, as described above, a plurality of predetermined blocks L are set in the data section 71 in one sector, and the block DSV value B is acquired for each block L. The block DSV values B obtained for the blocks L are accumulated and the sector DSV value A of the range from the head data to the block of interest is determined. The sector DSV value A of the range from the head data to that block of interest is compared with the block DSV value B of a new block LN+1 to determine the value of the adjust bit 75a belonging to that new block LN+1. The adjust-bit determining circuit 24 of this embodiment therefore has a smaller circuit scale than the prior art which has two circuits for acquiring the sector DSV value A by accumulating the DSV values over the range from the head data. Thus, the consumed power can be reduced by the reduction of the circuit scale.

According to this embodiment, the DSV value of user data before RLL (1, 7) code conversion is obtained two bits at a time in the DSV computation. More specifically, the adjust-bit determining circuit 24 of this embodiment executes the DSV computation on 2-bit user data using the conversion table 34a, the DSV-value conversion table 34d, etc. Therefore, the operation frequency of the adjust-bit determining circuit 24 of this embodiment becomes half of the frequency of user data, which is significantly lower than the conventional one. The consumed power of the adjust-bit determining circuit 24 of this embodiment is reduced by the reduction of the operation frequency.

According to this embodiment, predetermined data portions in the lockup pattern area 72, sync pattern area 73 and resync pattern 75 are immediately acquired as fixed values and output as such without performing the DSV computation in the DSV encoder 34. The processing speed for the DSV computation becomes faster and the operation of determining the adjust bit can be improved.

Although only one embodiment of the present invention has been described herein, it should be apparent to those skilled in the art that the present invention may be embodied in many other specific forms without departing from the spirit or scope of the invention. Particularly, it should be understood that the invention may be embodied in the following forms.

Although this embodiment is adapted to an optical disk apparatus which uses the optical disk 11 as a recording medium, this invention may be adapted to a disk apparatus which uses a magnetic disk or any similar computer-readable medium.

Although the value of the adjust bit in computing DSV values is set to "0" in this embodiment, it may be set to "1" as well.

While DSV values are acquired two bits at a time in this embodiment, they may be obtained in units of a different number of bits than two, i.e., one or a number which is greater than two.

Although two tables 34a and 34d are provided in this embodiment, DSV values may be acquired directly from user data using a single table.

Therefore, the present examples and embodiments are to be considered as illustrative and not restrictive and the invention is not to be limited to the details given herein, but may be modified within the scope of the appended claims.

What is claimed is:

1. A method of determining an adjust bit value for a block of write data included in a data section on a recording medium, said data action including a plurality of blocks, said write-data being derived from received user data, said method comprising the steps of:

performing code conversion on said user data;

performing pulse width modulation on said converted user data in order to derive said write data; and determining said adjust bit value based on an analysis of blocks DSV values and sector DSV values of said write data in such a manner that a sum of DC levels of said write data approaches zero, said adjust bit determining step including the steps of:

A) continuously computing block DSV values block by block for said write data belonging to said plurality of blocks of said data section, B) accumulating said computed block DSV values to acquire a temporary sector DSV value for write data ranging from a head block to a current block in said data section, and C) comparing said temporary sector DSV value with a next block DSV value of a next block adjacent to said current block, whereby an adjust bit value for said next block is determined in such a manner that a new sector DSV value obtained by adding said temporary sector DSV value to said next block DSV value approaches to zero.

2. The method according to claim 1, wherein DSV values are acquired from said user data two bits at a time by referring to a predetermined conversion table, and DSV values of said 2-bit data are sequentially accumulated to acquire said block DSV values.

3. The method according to claim 2, wherein said conversion table includes a first conversion table for converting said user data to RLL (1, 7) codes two bits at a time, and a converted-value table indicating a relation between said converted user data and DSV values.

4. The method according to claim 2, wherein predetermined DSV values are prepared for pattern data other than said user data, are recorded in said data section, and are used for computing a block DSV value.

5. An adjust-bit determining circuit for determining an adjust bit value for a block of write data included in a data section on a recording medium, said data section including a plurality of blocks, said write data being derived from received user data, said circuit comprising:

an encoder for receiving user data two bits at a time and outputting DSV values for said 2-bit user data; a control circuit;

a first circuit group for accumulating said DSV values from said encoder to acquire block DSV values block by block of data belonging to said plurality of blocks of said data section under control of said control circuit;

a second circuit group for accumulating said block DSV values computed by said first circuit group in order to acquire a temporary sector DSV value ranging from a head block to a current block in said data section, said second circuit group under control of said control circuit; and a determining circuit, coupled to said first and second circuit groups, for comparing said temporary sector DSV value computed by said second circuit group with a next block DSV value of a next block adjacent to said current block, said next block DSV value computed by said first circuit group, whereby said determining circuit determines an adjust bit value for said next block in such a manner that a new sector DSV value obtained by adding said temporary sector DSV value to said next block DSV value approaches zero.

6. The adjust-bit determining circuit according to claim 5, wherein said encoder includes a conversion table for converting said user data to RLL (1, 7) codes two bits at a time, and a converted-value table indicating a relation between said converted user data and DSV values.

7. The adjust-bit determining circuit according to claim 5, wherein said control circuit includes a DSV sequencer.

8. The adjust-bit determining circuit according to claim 5, wherein said first circuit group includes:

an added-value selector coupled to said encoder;

an adder coupled to said added-value selector; and a block DSV register provided between said adder and said determining circuit.

9. The adjust-bit determining circuit according to claim 5, wherein said second circuit group includes:

an added-value selector coupled to said encoder;

an adder coupled to said added-value selector;

a block DSV register provided between said adder and said determining circuit; and a sector DSV register provided in parallel with said block DSV register between said adder and said determining circuit.

10. A write-data producing circuit for receiving user data from a memory of a computer and producing write data to be written to said recording medium, said write-data producing circuit comprising:

an adjust-bit determining circuit for determining an adjust bit for write data as recited in claim 5, said adjust bit determining circuit coupled to said memory;

a delay buffer coupled to said memory; and a write-data preparing circuit, coupled to said delay buffer and said adjust bit determining circuit, for outputting said write data.

11. A disk apparatus for receiving said user data and writing said write data to an optical disk, said disk apparatus comprising:

a write data producing circuit as recited in claim 10;

a signal processor coupled to said write data producing circuit; and a recording head coupled to said signal processor for recording said write data on said optical disk.

*12. A method of determining an adjust bit value for a block of write data included in a data section of a recording medium, the data section including a plurality of blocks, wherein the write data is derived from user data, the method comprising:*

*performing code conversion on the user data to derive the write data; and*

*determining the adjust bit value in such a manner that a sum of DC levels of the write data approaches zero, and determining DSV values using the user data on which the code conversion is not performed.*

*13. An adjust bit determining circuit for determining an adjust bit value for a block of write data included in a data section of a recording medium, the data section including a plurality of blocks, wherein the write data is derived via code conversion on the user data, and the adjust bit value is determined such that a sum of DC levels of the write data approaches zero, the circuit comprising:*

*an encoder for receiving the user data on which the code conversion is not performed and outputting DSV values for the user data.*

* * * * *

UNITED STATES PATENT AND TRADEMARK OFFICE

CERTIFICATE OF CORRECTION

PATENT NO. : RE 38,719 E
DATED : April 5, 2005
INVENTOR(S) : Masayuki Ishiguro

It is certified that error appears in the above-identified patent and that said Letters Patent is hereby corrected as shown below:

Column 17,
Line 1, replace “action” with -- section --.

Signed and Sealed this

Twentieth Day of December, 2005

JON W. DUDAS
*Director of the United States Patent and Trademark Office*